US009164832B2

(12) United States Patent
Gaertner et al.

(10) Patent No.: US 9,164,832 B2
(45) Date of Patent: Oct. 20, 2015

(54) ECC MANAGEMENT FOR VARIABLE RESISTANCE MEMORY CELLS (71) Applicant: Seagate Technology LLC, Cupertino, CA (US)

(72) Inventors: Mark Allen Gaertner, Vadnais Heights, MN (US); Ryan James Goss, Prior Lake, MN (US); Antoine Khoueir, Apple Valley, MN (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 146 days.

(21) Appl. No.: 13/779,434

(22) Filed: Feb. 27, 2013

(65) Prior Publication Data
US 2014/0245108 A1  Aug. 28, 2014

(51) Int. Cl.
G11C 29/00 (2006.01)
G06F 11/10 (2006.01)
G11C 17/16 (2006.01)
G11C 13/00 (2006.01)

(52) U.S. Cl.
CPC ........ *G06F 11/1048* (2013.01); *G06F 11/1008* (2013.01); *G06F 11/1044* (2013.01); *G11C 13/0002* (2013.01); *G11C 17/165* (2013.01)

(58) Field of Classification Search
USPC .................................................. 714/763, 774
See application file for complete search history.

(56) References Cited

U.S. PATENT DOCUMENTS

| 7,191,327 | B2 | 3/2007 | Viljoen et al. |
| 7,295,462 | B2 | 11/2007 | Farnworth |
| 7,506,335 | B1 | 3/2009 | Wooff et al. |
| 7,539,048 | B2 | 5/2009 | Farnworth |
| 7,797,525 | B2 | 9/2010 | Lee et al. |
| 7,873,059 | B2 | 1/2011 | Morita et al. |
| 8,027,207 | B2 | 9/2011 | Fifield et al. |
| 8,028,155 | B1 | 9/2011 | Righi et al. |
| 8,095,851 | B2 | 1/2012 | Diggs et al. |
| 8,122,322 | B2 | 2/2012 | Miller |
| 8,159,869 | B2 | 4/2012 | Park et al. |
| 8,199,603 | B2 | 6/2012 | Chung et al. |
| 2003/0023928 | A1* | 1/2003 | Jedwab et al. ................ 714/763 |
| 2003/0172135 | A1 | 9/2003 | Bobick et al. |
| 2005/0135165 | A1* | 6/2005 | Smith et al. ................... 365/200 |
| 2007/0260962 | A1* | 11/2007 | Wise et al. .................... 714/763 |
| 2010/0023870 | A1 | 1/2010 | Baker |
| 2010/0027327 | A1 | 2/2010 | Chung et al. |
| 2011/0075473 | A1 | 3/2011 | Park et al. |
| 2011/0188292 | A1 | 8/2011 | Joo et al. |

(Continued)

OTHER PUBLICATIONS

Lee, et al., "A fast, high-endurance and scalable non-volatile memory device made from asymmetric Ta2O5_xl TaO2_x bilayer structures,"Nature Materials, Jul. 10, 2011, pp. 1-6, Doi: 10.1038/NMAT3070; Macmillan Publishers Limited. X.

(Continued)

*Primary Examiner* — M. Mujtaba K Chaudry
(74) *Attorney, Agent, or Firm* — Hall Estill Attorneys at Law (57) ABSTRACT

A data storage device may generally be constructed and operated with at least a controller configured to identify a variance from a predetermined threshold in at least one variable resistance memory cell and upgrade a first error correction code (ECC) level to a second ECC level for the at least one variable resistance memory cell.

20 Claims, 5 Drawing Sheets

(56) References Cited

U.S. PATENT DOCUMENTS

| | | | |
|---|---|---|---|
| 2011/0289386 A1* | 11/2011 | Yang | 714/764 |
| 2012/0144270 A1* | 6/2012 | Diggs et al. | 714/769 |
| 2012/0260159 A1 | 10/2012 | Lazier et al. | |
| 2012/0284230 A1 | 11/2012 | Adkins et al. | |
| 2014/0019824 A1* | 1/2014 | Varanasi | 714/758 |
| 2014/0160845 A1* | 6/2014 | Ratnam et al. | 365/185.09 |

OTHER PUBLICATIONS

Zhang, et al., "Helmet: A Resistance Drive Resilient Architecture for Multi-level Cell Phase Change Memory System,"Intelligent Design of Efficient Architectures Laboratory (Ideal), Department of Electrical and Computer Engineering, University of Florida.

\* cited by examiner

ECC MANAGEMENT FOR VARIABLE RESISTANCE MEMORY CELLS

SUMMARY

Various embodiments may generally be directed to the management of data storage device having variable resistance memory cells.

In accordance with some embodiments, a data storage device may have at least a controller configured to identify a variance from a predetermined threshold in at least one variable resistance memory cell and upgrade a first error correction code (ECC) level to a second ECC level for the at least one variable resistance memory cell.

DETAILED DESCRIPTION

Continual industry emphasis on data storage devices with reduced form factors and increased data storage capacity that can more accurately and quickly access stored data has strained the material and operational characteristics of various rotating data storage environments like magnetic shielding during data writing and reading. The proliferation of solid-state memory cells has been able to provide reduced power consumption, size, heat production, and vibration sensitivity to allow greater data storage to be utilized in mobile and hybrid data storage devices. While a data storage device can comprise one or more solid-state memory cells to minimize stresses on rotating data storage, solid-state memory can also experience operational conditions that threaten the accuracy and access speeds of stored data.

One such condition may be resistance variations in memory cells that store data as different resistance states. The deviation of resistance from predetermined thresholds can lead to increased data errors and data access times as memory cells are repeatedly read without confirmation of a stored logical value. While testing, error detection, and error correction codes (ECC) have been proposed in a variety of forms, such as Reed-Solomon, checksum, Reed-Muller, parity, convolutional, and Binary Golay, such activities can be costly in terms of processing overhead and temporary memory cell deactivation. Hence, there is a continued industry goal associated with more efficiently managing existing and future errors in data storage devices like those stemming from inadvertent resistance variations.

Accordingly, various embodiments can be generally directed to data storage devices constructed with at least a controller configured to identify a variance from a predetermined threshold in at least one variable resistance memory cell and upgrade a first error correction code (ECC) level to a second ECC level for the at least one variable resistance memory cell. The identification of a predetermined resistance threshold may be conducted in proactive or reactive manners that allow for optimized use of a storage device's processing capacities without impinging on data access reliability or speed. The ability to efficiently manage progressively more robust levels of ECC without impinging on data availability, access speeds, and system processing overhead can provide sustained performance despite the presence of memory cells with deviated operational characteristics.

Figure 1:
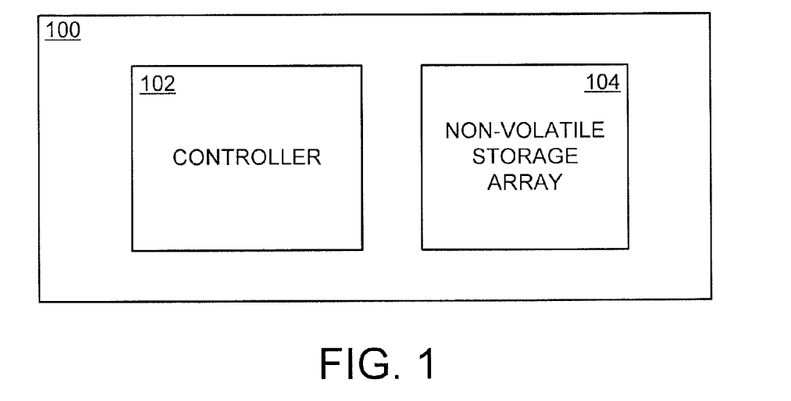
FIG. 1 provides a block representation of a data storage device constructed and operated in accordance with various embodiments.

A variable resistance solid-state memory cell may be utilized and assigned one of many different ECC schemes in a variety of non-limiting data storage environments. FIG. 1 provides a block representation of an example data storage device 100 in which various embodiments can be practiced. The device 100, which in some embodiments is configured as a solid-state drive (SSD), has a top level controller 102 and a non-volatile data storage array 104 that may be connected via an unlimited variety of electrical interconnections like wiring, interfaces, busses, and multiplexers. The controller 102 can be used to facilitate the transfer of user data between the storage array 104 and a host device that is internal or external to the storage device 100.

In some embodiments, the controller 102 is a programmable microcontroller that can buffer data in at least one interface circuit pending a transfer between the array 104 and the host device. The position of the controller 102 and storage array 104 are not limited to the concurrent presence illustrated in FIG. 1 as any part of the storage device 100 element may be physically or logically absent while concurrently controlling various operational aspects of the storage device 100. That is, the physical presence of the controller 102 and storage array 104 are not required as either element can be positioned external to the storage device 100, such as across a network accessed with appropriate protocol, while facilitating scheduled and non-scheduled operations within the storage array 104. Similarly, additional external controllers and storage arrays may be present internally or externally to the storage device 100 to be selectively utilized, as scheduled and desired.

Figure 2:
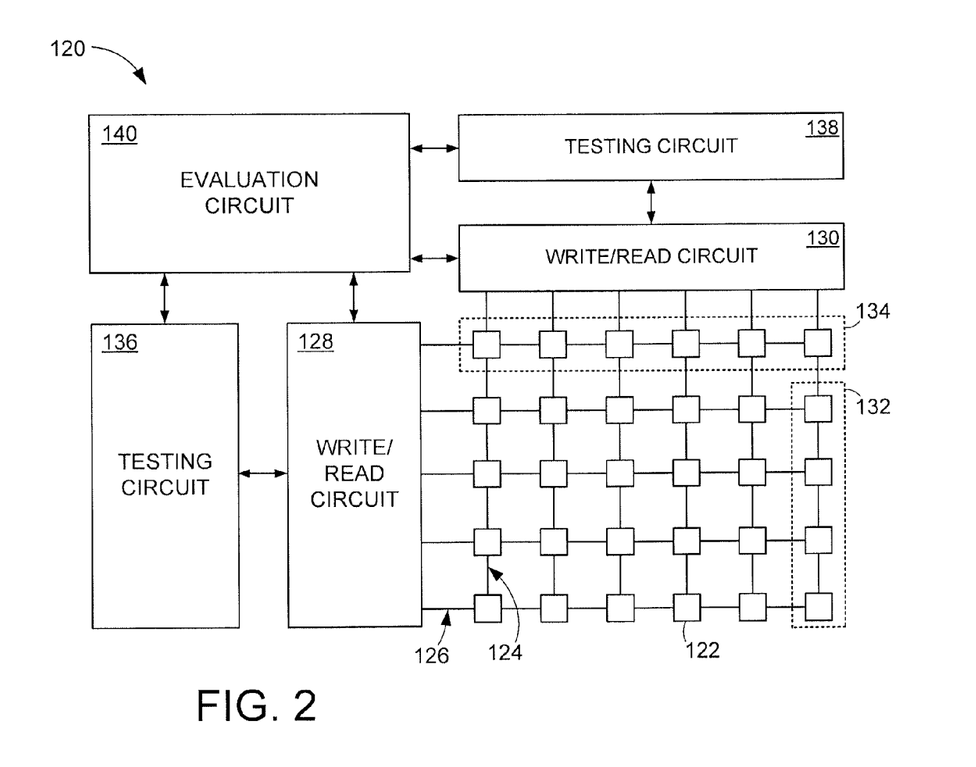
FIG. 2 shows a block representation of a portion of the memory array capable of being used in the data storage device of FIG. 1.

FIG. 2 generally illustrates a block representation of a portion of an example non-volatile storage array 120 that may be used in a data storage device like the device 100 in FIG. 1. A number of non-volatile memory cells 122 are arranged in rows and columns that correspond with the overlapping of electrical paths 124 and 126, such as bit and source lines, in an orientation that can be characterized as a cross-point array. One or more write/read circuits 128 and 130 can individually or concurrently control data being written to and read from selected memory cells 122 arranged in sectors 132, pages 134, blocks, and garbage collection units. Such control may be conducted with respect to multiple cells, such as an entire row, page, and block, to expedite data accesses.

A plurality of memory cells 122 are coupled via control lines 126 to an X (row) write/read circuit 128 and via control lines 124 to a Y (column) write/read circuit 130 that allow for write, rewrite, and read operations to be carried out on a predetermined number of the memory cells 122 either individually or collectively. The write/read circuits 128 and 130 can be configured, in some embodiments, to provide reference parameters, such as voltages, resistances, and pulse widths, that are catered to more than one type of solid-state memory cell. In other words, different sections of memory, such as different pages 134 or blocks of memory, can be configured physically and logically with different types of memory cells that each operate to store data, but correspond with different reference parameters that are provided by the write/read circuits 128 and 130 to accurately translate a read or write output into a logic state.

In a non-limiting example operation, the write/read circuits 128 and 130 may concurrently provide access to page 134 or unit 132 of memory cells for scheduled or unscheduled user and overhead system operations. One or more testing circuits 136 and 138 may provide row and column testing capabilities that are monitored, recorded, and evaluated by the evaluation circuit 140. The testing circuits 136 and 138 can be configured to place one or more memory cells 122 and pages 134 of memory in predetermined states, such as in a common logical and resistance value, that may or may not be online for user access in a testing mode characterized by passage of one or more quiescent current through the selected memory cells 122 to identify and differentiate one or more different types of cell defects, operating parameters, and types of memory. In other words, a single memory cell 122, or more cells concurrently or successively, may be taken offline and set to a testing mode by the testing circuits 136 and 138 to allow a plurality of testing currents to be passed through the cell(s) 122 to determine a variety of biographical, operational, and defective characteristics that are logged and evaluated in the evaluation circuit 140.

As such, the evaluation circuit 140 may direct operation of the testing circuits 136 and 138 as well as write/read 128 and 130 circuits to determine what and how memory cells 122 are operating in the data storage device 120. In some embodiments, the evaluation circuit 140 conducts evaluation and testing of some or all of the memory cells 122 prior to user data ever being written, which can provide baseline data that can be utilized later. Various embodiments further can periodically and sporadically conduct tests and evaluations of the operating characteristics of various memory cells 122. Such periodic testing may be conducted during predetermined and emergency times, such as low system processing and idle times, to identify various operational conditions like the resistance variances.

With the ability to test various memory cells 122 and groups of cells 132, the evaluation circuit 140 can adapt to identified static and dynamic variations in memory cell performance. However, the use of system resources to test and correct through ECC assignment the performance of one or more memory cells 122 can take up a hefty amount of system resources, especially in modern data storage systems that can access ECC tens and hundreds of thousands of times a second. Also, the reactive nature of corrections to memory cell 122 variances may not be conducted soon enough to ensure high data reliability and access speeds. Thus, the evaluation circuit 140 may be configured with a variety of capabilities to allow for the predictive adaptation of memory cells 122 to identified and imminent variances.

Figure 3:
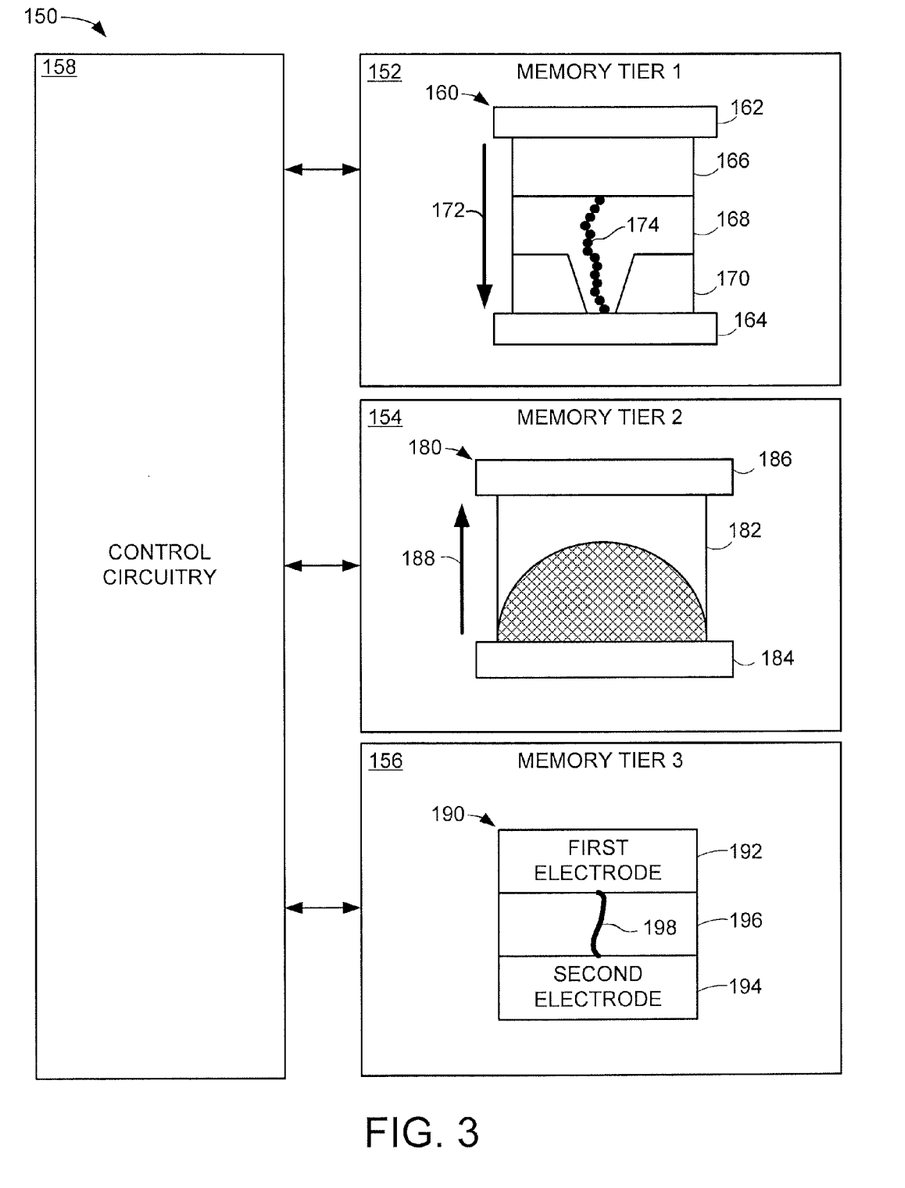
FIG. 3 displays a block representation of an example portion of a data storage device constructed and operated in accordance with some embodiments.

FIG. 3 illustrates a block representation of an example control portion 150 of a data storage device in accordance with various embodiments. The control portion 150 has a plurality of different memory tiers 152, 154, and 156 that are individually and collectively operated through control circuitry 158. In various embodiments, the various memory tiers correspond with different memory cell types. The first memory tier 152 can be constructed and operated with any of the illustrated programmable metallization cell (PMC) element 140. The PMC element 160 may be formed with top 162 and bottom 164 electrodes, a metal layer 166, an electrolyte layer 168, and a dielectric layer 170. Control circuitry 158 can be used to adjust the relative voltage potential between the first 162 and second 164 electrodes, resulting in passage of a write current 172 through the PMC element 160 to form a filament 174 that changes the resistance of the cell from a high resistance to a low resistance that can correspond to a first predetermined logic state, such as 1.

The filament 174 establishes an electrically conductive path between the metal layer 166 and the bottom electrode 164 by the migration of ions from the metal layer 166 and electrons from the bottom electrode 164. The dielectric layer 170 focuses a small area of electron migration from the bottom electrode 164 in order to control the position of the resulting filament 174. Subsequent application of a write current in an opposite second direction, through the PMC element 160 causes migration of the ions and electrons back to the respective electrodes 162 and 164 to resets the PMC element 160 to its initial high electrical resistance that corresponds with a different second predetermined logic state, such as 0. PMC elements with a construction similar to that shown at 160 can alternatively be programmed using unipolar programming currents of different magnitudes and/or pulse widths that are selectively provided by the control circuitry 158.

The second memory tier 154 is shown as another non-exclusive type of solid-state memory capable of being used in a data storage array in accordance with various embodiments is provided by the example phase change random access memory (PCRAM) element 180. The phase change element 180 has a phase change layer 182 disposed between top 184 and bottom 186 electrodes. While not required or limiting, the phase change layer 182 can be formed of a polycrystalline chalcogenide material of group VI of the periodic table, such as Tellurium (Te) and Selenium (Se) while in some embodiments, the phase change layer 182 is formed of $Ge_2Sb_2Te_5$ (GST) or In—Ge—Te.

To place the layer 182 into a relatively high resistance amorphous phase, a fairly high voltage potential is applied across the electrodes 184 and 186 to heat the layer 182 above its melting temperature. The voltage is removed rapidly so as to provide a relatively sharp cooling transition, which may be referred to as a quenching process. In such case, the atoms may not have sufficient time to relax and fully array into a crystalline lattice structure, thereby ending in a metastable amorphous phase and high resistance.

As shown, the phase change layer 182 can be programmed to a crystallized phase in response to joule heating caused by the passage of a suitable current 188 of relatively lower magnitude and longer duration through the element 180. The applied pulse is configured to raise the temperature of the layer so as to be above its glass transition temperature and below its melting temperature, and to gradually decrease in temperature back to ambient level. Such temperature gradient will generally provide sufficient dwell time for the material to crystallize. With the programming operation of the PCRAM element 180, data writing currents to place the layer 182 in the respective amorphous and crystalline phases can both be applied in a common direction (uniform polarity) 188, which may provide optimized data programming performance in some data storage arrays.

While the same types of solid-state memory can be used in multiple different memory tiers, the non-limiting embodiment displayed in FIG. 3 has a resistive random access memory (RRAM) element 190 utilized singularly or plural in the third memory tier 156. The RRAM element 190 has opposing metal or metal alloy electrode layers 192 and 194 that are separated by an intervening oxide layer 196. A first, higher resistance programmed state is established by the nominal electrical resistance of the oxide layer 196. Application of a suitable write voltage potential and/or write current in a selected direction across the element 190 can induce metal migration from the electrode layer 192 and the formation of one or more electrically conductive metallization filaments 198 through the oxide layer 196.

In some embodiments, the oxide layer 196 is configured as a lamination of different materials that can mitigate leakage current and lower programming current. As a non-limiting example, asymmetric $TaO_{2-x}$ and $Ta_2O_{5-x}$ can be have different thicknesses and form the oxide lamination. Such asymmetric oxide lamination can exhibit optimized endurance, data retention, and access speed that is scalable and can be access in a transistorless and diodeless cross-point array, such as the array 120 of FIG. 2.

Various embodiments may also use other resistive memory types, such as nanotube random access memory (NRAM), that employs a non-woven matrix of carbon nanotubes that are moved by Van Der Waal's forces to form high and low resistive states. The size and scalability of NRAM allows the memory to be used in a variety of different memory array applications like a switching device and memory cell. The low access currents associated with reading data from and writing data to further allows NRAM to be utilized individually or in combination with other resistive memory types to provide diverse data storage capabilities for the various memory tiers 152, 154, and 156 of the control portion 150.

Such filaments 198 generally operate to lower the characteristic resistance of the element 190 and provide different high and low resistance states that can correspond to different logic states. To return the programmed state of the element 190 to a high resistance state, an appropriate write voltage potential and/or current is applied between the electrodes 192 and 194 in a direction that rescinds the filament 198. The creation and subsequent removal of the filament 198 can be less than 10 ns with a 30 µA or less writing current, which may optimize data storage array performance by being implemented alone or in combination with other types of solid-state memory and assigned to operating conditions, such as user data, metadata, and spare cells, that maximize the element's 190 relatively fast programming time and low programming current.

The configuration of multiple different memory tiers can allow for the control circuitry 158 to employ sophisticated data management schemes in which the respective memory tiers 152, 154, and 156 have different memory types, like RRAM, PCRAM, and PCM, but similar memory cell functions, such as metadata and storage of user data, which the control circuitry 158 can selectively utilize to optimize data storage performance. For instance, data initially stored in the first memory tier 152 that is constructed as phase change memory cells can be moved for redundancy or relocation to RRAM memory cells of the second memory tier 154.

The ability to control the type of solid-state memory cell data is to be stored in further allows the various memory tiers to be used in an adaptive fashion to reactive and proactively identified memory cell operational deviations, such as resistance variations. However, it should be noted that the use of different types of memory cells may additionally provide cells with different resistances, reading, and writing profiles that correspond with differing tests and predictive models that are concurrently managed by at least the control circuitry 158 to maximize the adaptability of a memory array to variances in cell resistances.

Figure 4:
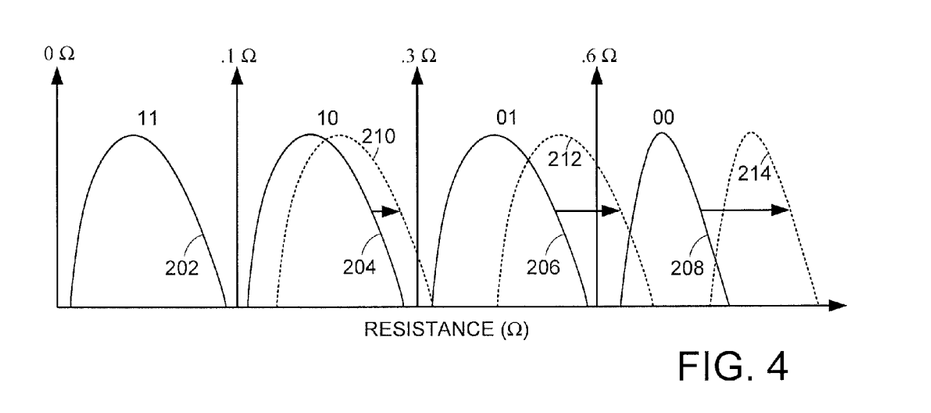
FIG. 4 graphically represents a number of programmed state distributions for an example memory cell.

FIG. 4 plots operational data from an example solid-state memory cell being utilized in a data storage array in accordance with some embodiments. The various resistance regions 202, 204, 206, and 208 respectively correspond to the resistance distributions for a plurality of memory cells programmed to logical values 11, 10, 01, and 00. In some embodiments, one or more solid-state memory cells of a data storage array are configured as a multi-level cell (MLC), which contrasts a single level cell that stores a single bit as either a logical value 0 or 1, by storing n number of bits as 2n logical bit values concurrently, as illustrated in FIG. 4.

While any number of different logical value designations may be utilized without restriction, a logical value convention in accordance with various embodiments assigns a logical value of 11 to the lowest resistance and logical values of 10, 01, and 00 to progressively higher resistances. Regardless of the logical value designations, various memory cell operations can contribute to an inadvertent shift in the resistance of a solid-state memory cell, as displayed by segmented regions 210, 212, and 214. For example but in no way limiting, the number of successive programming cycles of increasing and decreasing the stored resistance of a memory cell, the time a high resistance state has been continually stored in a memory cell, the temperature of a data storage array, and the amount of programming current used to program a memory cell can all contribute to an increase, or decrease, in stable resistance states for a single bit or multi-bit memory cell that increasingly complicate the accurate programming and sensing of data.

A solid-state memory cell, such as the elements 160, 180, and 190 of FIG. 3, can be constructed with materials, layer thicknesses, and overall dimensions conducive to repeatedly providing a plurality of distinct resistances based on a programming current. With the unwanted shift in the stored resistance ranges as illustrated by regions 210, 212, and 214 extending across logical state thresholds, such as $0.3\Omega$ and $0.6\Omega$, logic state accuracy can be tainted as a logical state like 01 can be read as a different state, like 00. Resistance shift may further be exacerbated by attempting to differentiate between stored logical states during a concurrent reading of a page or block of memory cells that contain numerous separate resistances, some of which may have varying degrees of resistance shift.

As the cause for resistance shift is not yet fully understood, prevention of resistance shift has not been reliable, even with the use of ECC. Accordingly, various embodiments are directed to reactive and proactive ECC management to the resistance shift in one or more memory cells identified through testing, observation, and evaluation across a wired or wireless network with appropriate protocol like testing and prediction circuitry.

Figure 5:
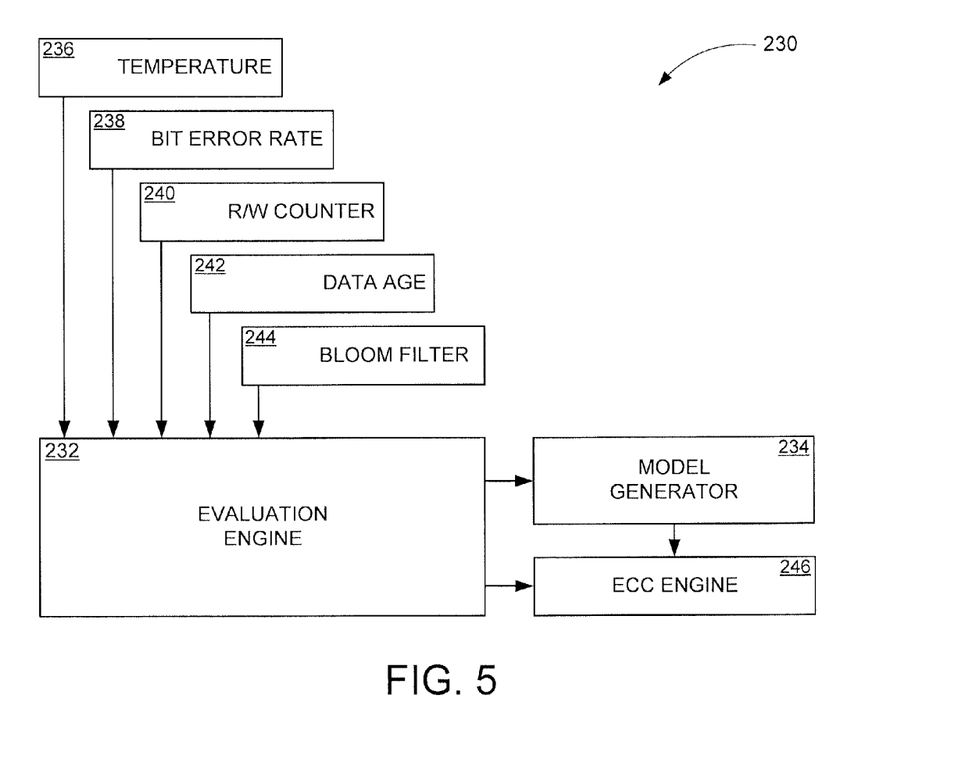
FIG. 5 is a block representation of an example control circuitry portion of a data storage device constructed in accordance with various embodiments.

FIG. 5 provides a block representation of a proactive portion 230 of an example data storage device configured and operated in accordance with various embodiments. An evaluation engine 232 may be separate, like across a wired or wireless network, or integrated within an evaluation circuit like the circuit 140 of FIG. 2. Irrespective of where the engine 232 is located, a plurality of different types of data may be separately recorded and evaluated by the engine 232 to be passed to a model generator 234 that can process the data and identify probable and imminent memory cell variations, such as resistance, logic state, and access time variations. For example but not limiting, sensors, processing circuits, and timers can provide at least temperature 236, bit error rate 238, read/write counter 240, data age 242, and bloom filter 244 conditions to the evaluation engine 232 for a diverse map of how a data storage array is performing.

One or more temperature sensors 236 can continually and sporadically measure the ambient air temperature of a data storage device as well as the localized temperature of a memory cell, page of memory, and die of memory pages. That is, the air temperature of a device can concurrently or successively lead to the monitoring of individual memory regions to detect particularly hot, or cold, locations. In some embodiments, a threshold temperature, such as 150° F., is set and triggers the investigation of a particular portion of a memory array once the threshold is surpassed. Such investigation may involve taking one or more memory cells offline for testing and predictively changing logic state resistances of cells exposed to temperatures outside a predetermined range. An investigation may result in additional increments may be provided to the read count for one or more memory cells.

A bit error rate (BER) 238 for one or more memory cells may also be monitored by the evaluation engine 232 to predict the physical and logical probability of memory cells that are operating outside of predetermined parameters, like data reliability. For example, a high bit error rate for a memory cell may trigger further investigation or adjustment of cells physically adjacent the identified call as well as cells logically connected to the identified cell via consecutive data accesses. The bit error rate may be monitored in tiers of memory, such as by blocks and pages, which can result in more efficient analysis as higher BER in higher tiers can subsequently correspond with analysis of fewer cells in lower memory tiers.

Various sectors, pages, blocks, and dies of memory can be continually monitored over an extended time, such as over the life to the data storage device, and for shorter times, such as during the previous hour and week, to provide a read/write counter 240 of the number of data accesses to the evaluation engine 232. Some types of memory and operational conditions, like PCRAM cells being accessed heavily, may be prone to resistance shift, which can be predicted and compensated for in advance. The counter 240 can, in some embodiments, log a multitude of data accesses, like the number of reads, writes, and rewrites, as well as the amount of current being passed through the memory cells to provide data to the evaluation engine 232 and model generator 234 with information on how the various memory cells are being accessed.

While counters may monitor accesses to one or more memory cells, an age counter 242 can operate to record the overall amount of time that has passed since a memory cell was written, read, and changed. Through various environmental and operational memory cell conditions, such as read disturb and undiscovered localized heating and trauma, the relocation of data can proactively improve the accuracy of data storage. The age counter 242 can be complemented by the measured and estimated bit error rate 258 and read/write counter 240 to provide a comprehensive memory cell map that allows the evaluation engine 232 and model generator 234 to create long-range and precise operational models predicting when and which memory cells will deviate from predetermined operational thresholds like resistance states.

A bloom filter 244 can be used to provide a weighted factor approach to track the data from the temperature 236, read/write counter 240, and data age counter 242 and provide the evaluation engine 232 with data that can efficiently be utilized by the model generator 234 to construct memory cell operational predictions. In some embodiments, a weighted factoring may provide an adjusted read count such as:

$$\text{Count(Adj)} = \text{Actual Reads} + K1(\text{Temp}) + K2(\text{Age}) + K3(\text{Delta-}V) \tag{1}$$

where Count(Adj) is an adjusted count value, Actual Reads represents an actual read operation, Temp is a temperature reading/range/zone, Age represents aging of the block, and Delta-V represents detected or predicted changes in cell resistance during a data access operation. Aging can be tracked in a variety of ways with module 242, such as in relation to a total number of writes and/or reads upon the selected memory location. The delta-V value can be utilized responsive to the application of different read voltage and resistance thresholds. It will be appreciated that other factors may be used.

The creation of accurate operation models via the model generator 234 can allow for an unlimited variety of proactive measures to be taken to optimize data storage device performance. One such proactive action may be sending testing data from the evaluation engine 232 and predicted operational data from the model generator 234 to an ECC engine 246 to assign and encode one of a plurality of different ECC levels processing for a page, block, die, and single memory cell.

Figure 6:
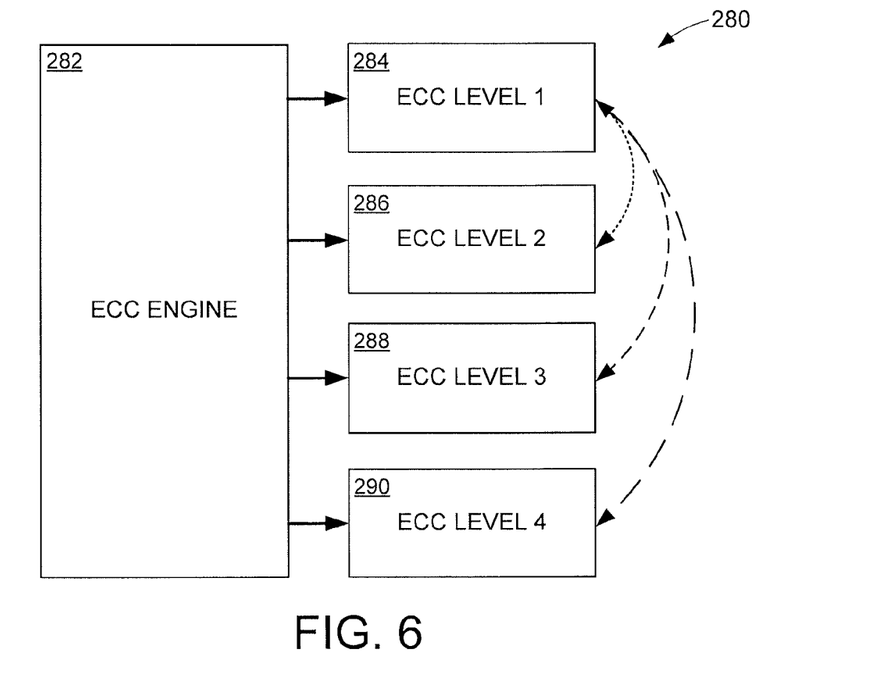
FIG. 6 provides a block representation of example control circuitry operated in accordance with some embodiments.

FIG. 6 illustrates a block representation of an example ECC portion 280 of a data storage device in accordance with some embodiments. An ECC engine 282, which can act alone or be directed by the evaluation engine and model generator of FIG. 5, may be capable of encoding and decoding at least four different levels of ECC. By no means required or limiting, a first ECC level 284 can be simplest and least processing intensive ECC scheme, like a checksum, that allows for basic error detection and correction without costing large amounts of system processing time. A reactive or proactive identification of a memory cell operational deviation, like a shift in resistance, can trigger the ECC engine 282 to upgrade the ECC level of the respective memory cell to a higher, more sophisticated ECC scheme of the second 286, third 288, and fourth 290 ECC levels.

Various embodiments configure the second ECC level 286 as a parity check, the third ECC level 288 as Reed-Soloman code, and the fourth ECC level as hybrid automatic repeat-request (HARQ) code. The ECC engine 282 can continually and sporadically monitor a variety of system parameters like processing capacity, scheduled processing activities, and channel quality to determine when and to what level an ECC upgrade is to be conducted. For some situations, an ECC upgrade can be a single level while in other situations an upgrade to the highest ECC level is warranted depending on a compromise of added ECC size and processing cost with increased error protection and correction.

The ability to predict the resistance shift in one or more memory cells can correspond, in some embodiments, with the proactive upgrading of other memory cells that are logically or physically adjacent the identified resistance shifted cell. That is, the ECC engine 282 may interpret received testing and model data to upgrade not just the identified deviated memory cell, bit also memory cells that are physically close to or within a logical sequence with the afflicted memory cell. Such proactive ECC upgrade may be conducted in tiers as memory cells closer to the identified cell may get a greater ECC level increase compared than cells distal to the deviated cell.

The predictive upgrade may further be conducted by the ECC engine 282 over time and in response to predetermined observed operational data. For instance, the proactive ECC upgrade of cells proximal to an identified memory cell may not immediately occur, but instead be scheduled to occur when a predetermined temperature, BER, or number data accesses is observed. In this way, the ECC engine 282 can adapt to changing data storage conditions, such as high data volume and reduced system resources, to upgrade ECC levels efficiently during scheduled user data writes.

Figure 7:
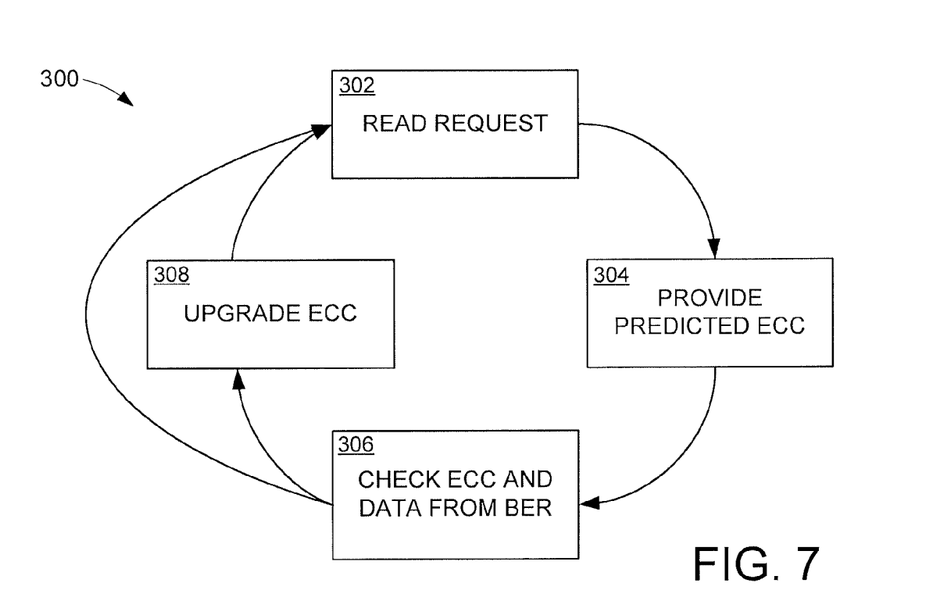
FIG. 7 displays a block representation of an example control circuitry constructed and operated in accordance with various embodiments.

As provided in the logical map 300 of FIG. 7, the ECC engine 282 can also evaluate and utilize user data reads to upgrade ECC levels for memory cells that have or have not been identified as deviating from predetermined resistance thresholds. The example logic loop 300 can begin with a read request 302 for data stored in one or more locations in a data storage device. The read request 302 can correspond with the retrieval of user data from a particular logical and physical block address (LBA and PBA) as well as metadata and ECC code stored elsewhere to direct the host to the most recent version of the user data and ensure that the data is accurate.

Step 304 can provide ECC that is predicted to correspond with the requested user data by the ECC engine, evaluation engine, and model generator. The prediction of ECC may be a function of any number of operational parameters and can take advantage of observed and tested information to reduce the time and processing cost of ECC retrieval. For example, a frequently accessed memory cell or page of memory may trigger the caching of corresponding ECC in a type of memory, such as PCRAM, that provides quick data retrieval and allows the stored ECC to be used for other memory cells.

The monitoring of the BER for the various memory cells and groups of memory can then be compared to the observed BER for the predicted ECC and user data in step 306 to check the accuracy of the predicted ECC. If the predicted ECC is correct and the BER of the retrieved data matches the BER benchmark, the loop 300 can advance to the next read request. However, a discrepancy between the observed and benchmark BER can cause step 308 to upgrade the ECC level of the predicted ECC and retrieved memory cell(s) to a new level commensurate with the size of the discrepancy from the benchmark BER.

Through various reading and writing operations, ECC for one or more memory cells can be evaluated, tested, and predicted to adjust for a variety of existing and predicted operational conditions. The complementing operation of the evaluation engine, model generator, and ECC engine can be utilized to manage the existing and predicted ECC to provide efficient and accurate data programming and reading. An example ECC management scheme may consist of creating a hierarchy of ECC for collective pages, blocks, and dies of memory cells where the ECC level corresponds to the size of the respective collections. That is, a low ECC level, such as a predicted checksum can be used for the reading and writing of data to a die of memory cells while a heightened ECC level, like Reed-Solomon code, can be used for a page of memory contained within the die.

Figure 8:
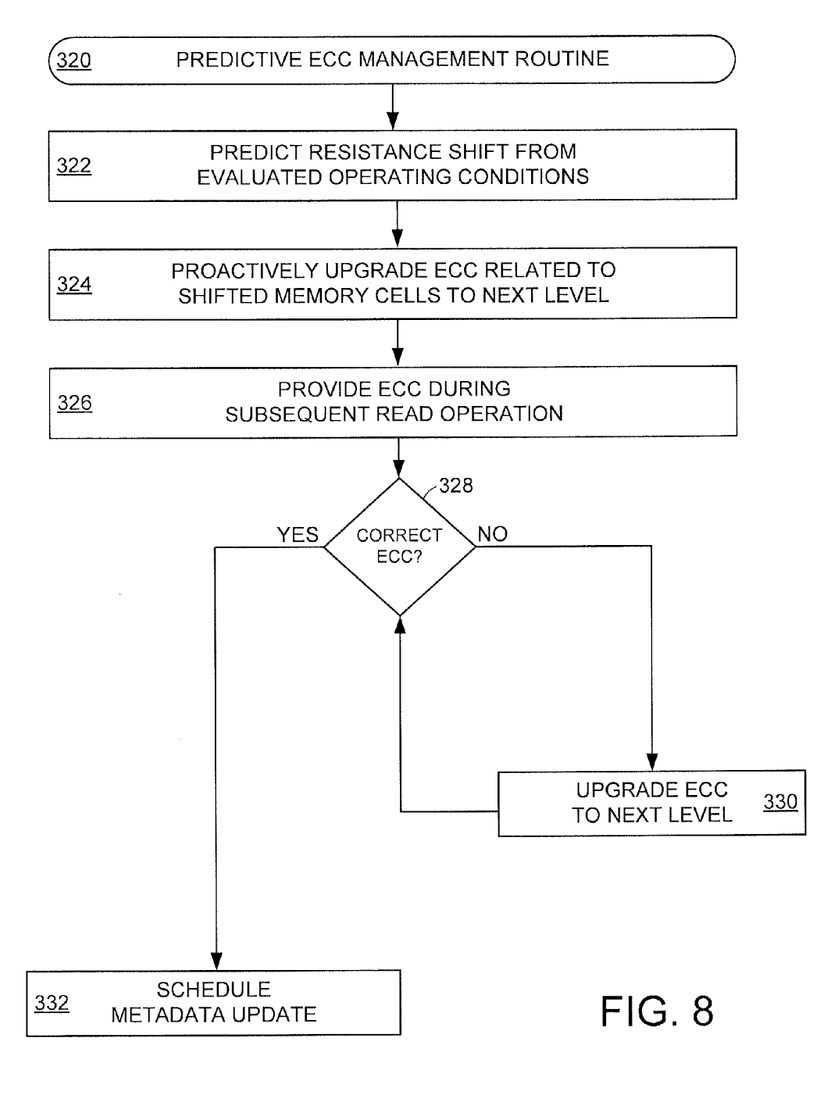
FIG. 8 illustrates an example proactive memory cell management routine carried out in accordance with some embodiments.

The configuration of ECC into a hierarchy based on the size of the memory array units can allow minimally system resource expensive ECC to be initially used before more processing costly ECC levels are utilized for smaller pages and sectors of memory. Such an ECC hierarchy can be optimized with the prediction of operational deviations in one or more memory cells contained in a die, block, page, and sector of memory by upgrading ECC levels at some, or all, of the memory regions to balance data access time with accurate data reading and writing. FIG. 8 provides an example predictive ECC management routine 320 that illustrates how ECC levels can be assigned and adjusted in accordance with various embodiments.

Initially, routine 320 can predict a resistance shift in step 322 based on evaluated operating conditions from a variety of processed data, such as temperature, bit error rate, and data access counters, that have undergone evaluation and modeling. Step 322 may involve the evaluation of logged operational and testing data concerning one or more memory cells to identify future deviations in resistance for cells that currently have not deviated from predetermined resistance thresholds. Such identification can be based on past evaluations and tests of defective cells or may be based on identified trends that suggest cell deviation from a predetermined threshold based on comparison to ECC levels suggested or optimized prior to the memory being activated for user control.

With a predicted resistance shift from step 322, step 324 subsequently upgrades the ECC level of at least the identified memory cell during a write operation or scheduled low system overhead time. As discussed above, the ECC level of physically and logically proximate memory cells, such as an entire sector and page of memory, can be proactively upgraded to various ECC levels in some scenarios. The ECC management routine 230 may continually loop between steps 322 and 324 with sustained write operations, but may also advance to step 326 to provide existing or predicted ECC at any time a read operation is conducted.

The production of previously stored or proactively generated ECC from step 326 is then evaluated in decision 328 for accuracy. In some embodiments, ECC for a plurality of memory cells, such as a page or block of memory, is collected and concurrently evaluated with decision 328. Decision 328 may evaluate the ECC and corresponding user data for accuracy through an unlimited variety of deterministic and empirical techniques, such as comparing BER, conducting parity checks, and data redundancy comparisons. Regardless of how decision 328 determines if the provided ECC is correct, a failure in the ECC proceeds to step 330 where the ECC at least for a single identified memory cell is upgraded to a more robust ECC scheme associated with a higher ECC level, as illustrated in FIG. 6.

Decision 328 and step 330 may be successively revisited any number of times to elevate the ECC level of the individual memory cell, page of memory, block of pages, and die of blocks to provide accurate data retrieval without impinging on processing resources and data access times. Step 330 may further schedule the upgrading of ECC levels to coincide with the next write operation to the particular block, page, or sector in which the user data corresponding with the upgraded ECC level resides.

With the ECC level of data upgraded to sufficiently provide accurate data reads, decision 328 advances to step 332 where an update to the metadata associated with the read user data is scheduled. Updated metadata may include at least the location of any new ECC data and forward pointers as well as the new PBA and LBA of user data if relocation or redundancy was employed as part of the upgraded ECC level. In the event the initial ECC is correct and no ECC level adjustment is made through step 330, step 332 can update the operational log in an evaluation circuit and engine instead of modifying metadata. It can be appreciated that the ECC management routine 320 is not limited to the displayed steps and decision as any portion of the routine 320 can be modified, moved, and omitted to accommodate a diverse variety of data storage device operations, such as hybrid data storage devices employing both rotational media and solid-state memory.

As shown in FIG. 8, predicting a resistance shift in one or more memory cells can correspond with ECC management that provides a level of ECC catered to the operational history and predicted operational future of the memory cell(s). The ability to predict ECC based on observed conditions and trends can further be used to manage ECC to provide a level of error detection and correction that ensures accurate data reading and writing without unduly degrading system performance. Moreover, the ability to utilize a multitude of different memory types for various ECC and user data storage can optimize memory cell and data storage array performance by allowing memory cells with existing and predicted ECC to be stored in memory types according to the operational advantages of each memory type.

It is to be appreciated that the claimed technology can readily be utilized in any number of applications, including network and mobile data storage environments. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed.

What is claimed is:

1. An apparatus comprising first and second variable resistance memory cells physically adjacent on a data storage medium and each having a first error correction code (ECC), a controller configured to upgrade the first ECC of the second variable resistance memory cell to a second ECC level in response to a resistance shift in the first variable resistance memory cell predicted by a model based on a weighted factoring provided by a bloom filter.

2. The apparatus of claim 1, wherein the at least one variable resistance memory cell is part of a solid-state memory array.

3. The apparatus of claim 2, wherein the solid-state memory array has a plurality of different types of variable resistance memory cells.

4. The apparatus of claim 3, wherein a first type of variable resistance memory cell comprises a programmable metallization cell.

5. The apparatus of claim 4, wherein a second type of variable resistance memory cell comprises a phase change random access memory cell.

6. The apparatus of claim 5, wherein a third type of variable resistance memory cell comprises a resistive random access memory cell.

7. The apparatus of claim 1, wherein the controller comprises an evaluation engine configured to concurrently analyze a plurality of different memory cell operational conditions to predict the resistance shift in the first variable resistance memory cell.

8. The apparatus of claim 7, wherein the evaluation engine provides a model generator with data to predict the resistance shift in the first variable resistance memory cell.

9. The apparatus of claim 1, wherein the predicted resistance shift in the first variable resistance memory cell corresponds with no predicted resistance shift the second variable resistance memory cell.

10. A method comprising predicting a resistance shift in a first variable resistance memory cell with a model based on a weighted factoring provided by a bloom filter and upgrading a first error correction code (ECC) level of a second variable resistance memory cell to a second ECC level, the first and second variable resistance memory cells being physically adjacent on a data storage medium and each having a first ECC prior to the upgrading step.

11. The method of claim 10, wherein the first ECC level comprises a checksum.

12. The method of claim 11, wherein the second ECC level comprises a parity check.

13. The method of claim 10, wherein the second ECC level comprises a different ECC scheme than the first ECC level.

14. The method of claim 10, wherein the controller uses a plurality of different operational parameters to generate a predicted model of variations in memory cell resistances.

15. The method of claim 14, wherein the predicted model is used by an ECC engine to predict ECC for predetermined memory cells.

16. The method of claim 10, wherein the first ECC level corresponds to a page of variable resistance memory cells and the second ECC level corresponds to an individual variable resistance memory cell.

17. A method comprising predicting a resistance shift in a first variable resistance memory cell with a model based on a weighted factoring provided by a bloom filter and proactively upgrading a first error correction code (ECC) level of the first variable resistance memory cell to a second ECC level and the first ECC level of a second variable resistance memory cell to a third ECC level, the first and second variable resistance memory cells being physically adjacent on a data storage medium, the first, second, and third ECC levels being different.

18. The method of claim 17, wherein a non-identified variable resistance memory cell logically proximal the first variable resistance memory cell is upgraded to from the first ECC level to the second ECC level.

19. The method of claim 17, wherein a non-identified variable resistance memory cell physically proximal the first variable resistance memory cell is upgraded to from the first ECC level to the second ECC level.

20. The method of claim 17, wherein the first ECC level is predicted in response to observed operational data from an evaluation engine portion of the controller.

* * * * *

UNITED STATES PATENT AND TRADEMARK OFFICE
CERTIFICATE OF CORRECTION

| | | |
|---|---|---|
| PATENT NO. | : 9,164,832 B2 | Page 1 of 1 |
| APPLICATION NO. | : 13/779434 | |
| DATED | : October 20, 2015 | |
| INVENTOR(S) | : Gaertner et al. | |

It is certified that error appears in the above-identified patent and that said Letters Patent is hereby corrected as shown below:

Title Page 1, item (56) in OTHER PUBLICATIONS
"Nature Materials, Jul. 10, 2011, pp.1-6, Doi: 10.1038/NMAT3070; Macmillan Publishers Limited.X" should be "Nature Materials, Jul. 10, 2011, pp.1-6 DOI: 10.1038/NMAT3070; Macmillan Publishers Limited"

Title Page 2, Column 2, item (56) in OTHER PUBLICATIONS
"(Ideal)" should be "(IDEAL)"

In the Claims
In Col. 12, line 40
"upgraded to from" should be "upgraded from"

Signed and Sealed this
Thirty-first Day of May, 2016

Michelle K. Lee
*Director of the United States Patent and Trademark Office*